US008241989B2

(12) United States Patent
Hofmann (10) Patent No.: US 8,241,989 B2
(45) Date of Patent: Aug. 14, 2012

(54) INTEGRATED CIRCUIT WITH STACKED DEVICES

(75) Inventor: Franz Hofmann, Munich (DE)

(73) Assignee: Qimonda AG, Munich (DE)

( * ) Notice: Subject to any disclaimer, the term of this patent is extended or adjusted under 35 U.S.C. 154(b) by 672 days.

(21) Appl. No.: 12/271,313

(22) Filed: Nov. 14, 2008

(65) Prior Publication Data

US 2010/0123202 A1    May 20, 2010

(51) Int. Cl.
  *H01L 21/76* (2006.01)
(52) U.S. Cl. ........ 438/421; 438/107; 438/109; 438/257; 438/422; 257/278; 257/314; 257/315; 257/522; 257/E21.581; 257/E21.614
(58) Field of Classification Search ................. 257/211, 257/314, E29.129, 315, 278, 522, E21.573, 257/E21.581, E21.614; 438/257, 107, 109, 438/421
See application file for complete search history.

(56) References Cited

U.S. PATENT DOCUMENTS

| 7,224,020 B2 * | 5/2007 | Wang et al. ............... 257/317 |
| 7,348,618 B2 * | 3/2008 | Woo et al. ................. 257/296 |
| 2008/0067554 A1 * | 3/2008 | Jeong et al. .............. 257/211 |

OTHER PUBLICATIONS

"3D Device Stacking Technology for Memory", Jaehoon Jang, et al., Samsung Electronics Co., Ltd., Semiconductor R&D Division.
"Laser-induced Epitaxial Growth (LEG) Technology for High Density 3-D Stacked Memory with High Productivity", Yong-Hoon Son, et al., 2007 Symposium on VLSI Technology Digest of Technical Papers.
"Three Dimensionally Stacked NAND Flash Memory Technology Using Stacking Single Crystal Si Layers on ILD and TANOS Structure for Beyond 30nm Node", Soon-Moon Jung, et al., 2006 IEEE.

* cited by examiner

*Primary Examiner* — Matthew E Warren
*Assistant Examiner* — John Lin
(74) *Attorney, Agent, or Firm* — Dicke, Billig & Czaja, PLLC (57) ABSTRACT

An integrated circuit with stacked devices. One embodiment provides a surface of a first semiconductor structure of a first crystalline semiconductor material including first and second portions. First structures are formed on the first portions. The second portions remain uncovered. Sacrificial structures of a second, different crystalline material are formed on the second portions. A second semiconductor structure of the first crystalline semiconductor material is formed over the sacrificial structures and over the first structures.

18 Claims, 10 Drawing Sheets

INTEGRATED CIRCUIT WITH STACKED DEVICES

BACKGROUND

Conventional linear shrinkage of semiconductor devices approaches to lithography and physical limitations. One way to overcome the issues caused by the conventional linear shrinkage is to stack the semiconductor devices three-dimensionally, for example, via chip-to-chip or chip-to-wafer stacking technologies. Another stacking technology applicable, for example, for integrated circuits with memory cells, is a 3D device stacking technology which includes the formation of at least a second single-crystalline semiconductor layer above electronic or micromechanical devices that are formed over and/or in a first single-crystalline semiconductor layer or semiconductor base.

For these and other reasons, there is a need for the present invention.

SUMMARY

One embodiment provides an integrated circuit and method. A surface of a first semiconductor structure of a first crystalline semiconductor material includes first and second portions. First structures are formed on the first portions. Sacrificial structures of a second crystalline material are formed on the second portions. A second semiconductor structure of the first crystalline semiconductor material is formed over the sacrificial structures and over the first structures, wherein a lattice information may be transferred from the first to the second semiconductor structure.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that one or more embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide for low-complex device stacking methods that reliably ensure the formation of further high quality single-crystalline semiconductor tiers over a first single-crystalline semiconductor tier.

FIGS. 1A to 1G refer to a 3D device stacking method for a memory cell array with NAND strings, wherein in each NAND string a plurality of memory cells is connected in series between two selection transistors. The FIGS. 1A to 1G illustrate a substrate portion 100 of an integrated circuit at different process stages respectively.

Figure 1A:
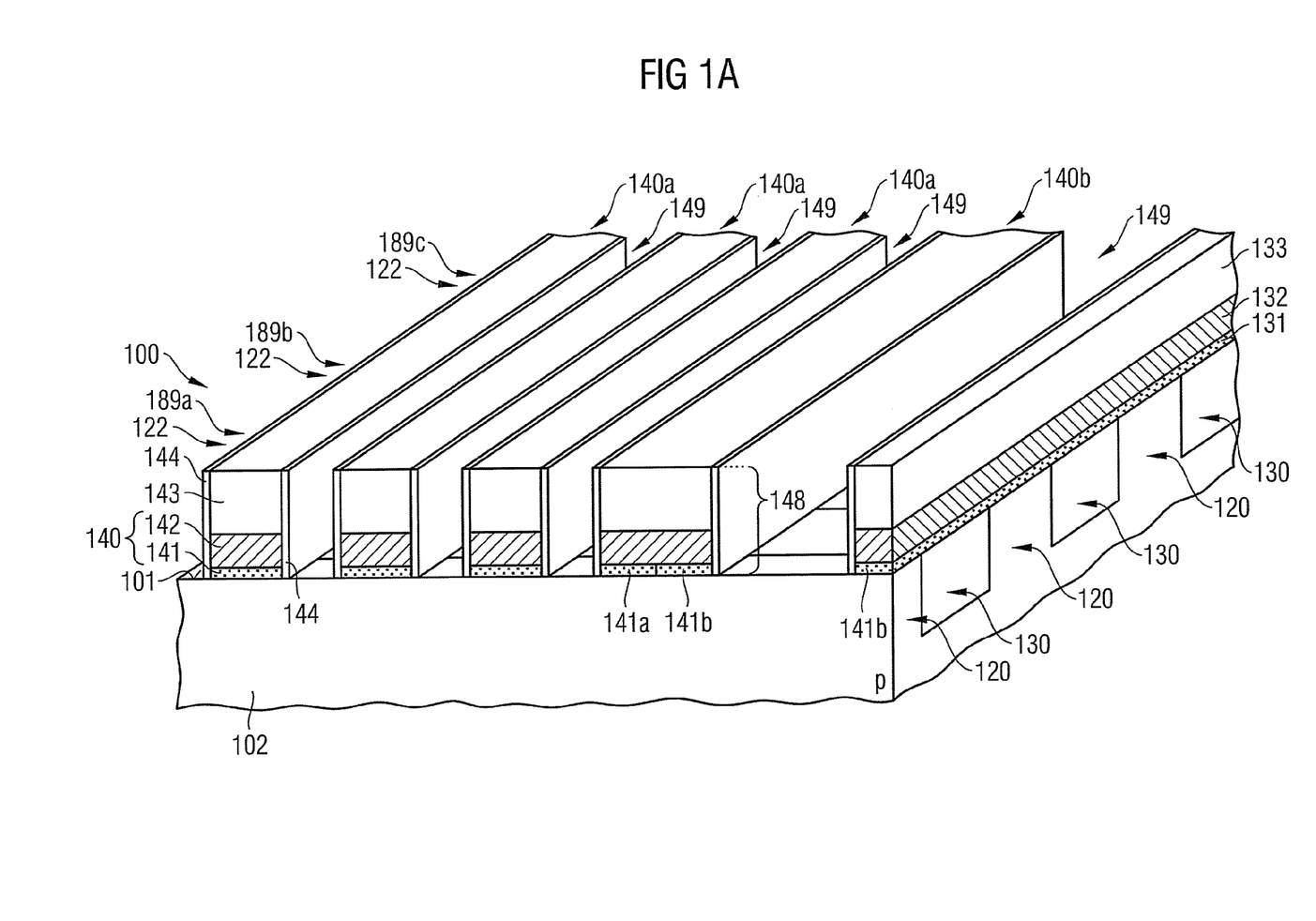
FIG. 1A illustrates a schematic perspective view of one embodiment of a substrate portion including gate structures in a first tier that includes a first semiconductor structure of a first crystalline semiconductor material for illustrating a method of manufacturing an integrated circuit according to one embodiment, after forming sidewall spacers along vertical sidewalls of the gate structures.

According to FIG. 1A, a layered first semiconductor structure 102 is provided, which is of a first crystalline semiconductor material. In accordance with one embodiment, the first crystalline semiconductor material is a single-crystalline semiconductor material. The first crystalline semiconductor material may form a first lattice, for example, a face-centered cubic lattice like a diamond cubic lattice or a zinc blende lattice and may be single-crystalline silicon, single-crystalline germanium, a silicon germanium alloy $Si_xGe_{(1-x)}$, or a A(III)-B(V) material. The first semiconductor structure 102 may be arranged on a semiconducting or insulating base. For example, the first semiconductor structure 102 may be a portion of a silicon wafer or the silicon portion of a Silicon-on-Insulator (SoI) wafer. The first semiconductor structure 102 may include further doped and undoped portions, epitaxial semiconducting structures as well as further conductive and insulating structures that have previously been fabricated.

A sacrificial oxide may be formed on a main surface 101 of the first semiconductor structure 102 by deposition or by oxidation of the first crystalline semiconductor material. Then an implant may be performed to form doped well structures in portions of the first semiconductor structure 102 next to or directly adjoining the main surface 101. Then the sacrificial oxide may be removed, for example, via an etch process. The main surface 101 may be on that side of the semiconductor structure 102 at which all or the majority of electronic circuits is formed in the following, for example, that side of a virgin semiconductor wafer which is exposed to the majority of patterning processes and on which further epitaxy layers may be grown.

A first mask material, for example, silicon nitride, carbon or amorphous silicon, may then be deposited to form a first hard mask layer on the first semiconductor structure 102, which may be covered with a sacrificial oxide. The first hard mask layer may be patterned by lithography techniques, which may include double patterning methods like pitch multiplication or double exposure, to form a first hard mask which may include parallel mask stripes running along a first direction. Using the first hard mask as an etch mask, an anisotropic etch, for example, a reactive ion beam etch (RIE) may be performed to form first grooves in the first semiconductor structure 102. A first insulator material may be deposited using, for example, chemical vapor deposition (CVD), high density plasma-chemical vapor deposition (HDP-CVD), atomic layer deposition (ALD), metal organic chemical vapor deposition (MOCVD), physical vapor deposition (PVD) or jet vapor deposition (JVD). The first grooves are filled, wherein shallow trench isolation structures 130 are formed in the first grooves. The shallow trench isolation structures 130 separate neighboring stripe-shaped first active area lines 120 in the first semiconductor structure 102. The first insulator material may be a dielectric material such as silicon dioxide $SiO_2$, silicon oxide $Si_xO_y$, boro-phosphorous silicate glass (BPSG), fluorinate silica glass (FSG), or boro-silicate glass (BSG). Portions of the first insulator material deposited above the main surface 101 may be recessed, for example, by chemical mechanical polishing (CMP) or a wet etch recessing the deposited first insulator material. Thereafter, the first hard mask may be removed, for example, via a selective wet etch process. According to one or more embodiments, the sequence of shallow trench isolation formation and well implants may be inverted.

First structures, for example, of a cover material, may then be formed on first portions of the main surface 101. The first structures may be gate electrodes of field effect transistors (FETs) or transistor-based volatile or non-volatile memory cells, by way of example. In accordance with one embodiment, a storage layer system 131 may be deposited on the main surface 101 using CVD, HDP-CVD, ALD, MOCVD, PVD, JVD, by way of example. The storage layer system 131 may include one or more conductive or non-conductive storage layers sandwiched between two dielectric layer systems. For example, the storage layer system 131 may include a storage layer which is a charge trapping layer in which charge carriers may be injected via Fowler-Nordheim-Tunneling or hot carrier injection, by way of example. In accordance with one embodiment, the storage layer system 131 may include a nitride layer sandwiched between an alumina and a silicon oxide layer or a nitride layer sandwiched between two silicon oxide layers. A gate conductor system 132, which may include one or more gate conductor layers of doped or undoped polysilicon, a metal, a metal silicide and/or a metal nitride, may be deposited onto the storage layer system 131. A first dielectric material 133, for example, doped or undoped silicon oxide, such as $SiO_2$, $Si_xO_y$, BPSG, BSG, FSG, by way of example may be formed on the gate conductor system 132 using CVD, HDP-CVD, ALD, MOCVD, PVD, JVD, by way of example. In accordance with one embodiment the first dielectric material is the same as the first insulator material.

A second mask material, for example, silicon nitride, carbon or amorphous silicon, may be deposited using CVD, HDP-CVD, ALD, MOCVD, PVD, JVD, by way of example, and may be patterned by lithography techniques, which may include double patterning methods like pitch multiplication, to form a second hard mask with parallel stripes running along a second direction intersecting the first direction. In accordance with one embodiment, the second hard mask stripes run perpendicular to the first hard mask stripes. A second anisotropic etch masked by the second hard mask is performed which cuts through at least the first dielectric material 133 and the gate conductor system 132 and which may cut through a portion of or through the complete storage layer system 131 to form parallel stripe-shaped address lines 140a and select lines 140b. In accordance with one embodiment, the second anisotropic etch stops at the main surface 101. Portions of the address lines 140a situated above the active area lines 120 may form first gate stacks 140 which may be assigned to memory cells. Portions of the select lines 140b situated above the active area lines 120 may form second gate stacks 148 which may be assigned to select transistors. Second grooves 149 separate neighboring address and select lines 140a, 140b. The second hard mask may be removed using via a selective wet etch process or a chemical mechanical polishing, by way of example.

Dielectric sidewall spacers 144 may be formed, for example, by depositing a conformal dielectric liner of, for example, a silicon oxide, a silicon oxynitride or a silicon nitride, and anisotropically etching the conformal dielectric liner to form the sidewall spacers 144 extending along vertical sidewalls of the address and select lines 140a, 140b.

As illustrated in FIG. 1A, the first and second gate stacks 140, 148 are arranged in a plurality of parallel cell rows 122 running parallel to the active area lines 120. Each first and second gate stack 140, 148 may include a storage system 141 formed from a portion of the storage layer system 131 and arranged in direct contact with the main surface 101 and a gate electrode 142 formed from a portion of the gate conductor system 132 and situated in direct contact with the storage system 141. In lieu of the storage system 141, the second gate stacks 148 may contain a single-layered gate dielectric without storage layer. In accordance with another embodiment, each second gate stack 148 contains a storage system portion 141a equivalent to the storage system 141 and a gate dielectric portion 141b without storage layer formed on the main surface 101 adjacent to the storage system portion 141a. The gate dielectric portion 141b may contain one or more of the sub-layers of the storage system portion 141a. Dielectric caps 143 formed from portions of the first dielectric material 133 may cover each first and second gate stack 140, 148. The second grooves 149 may run approximately perpendicular to the cell rows 122 and separate gate stacks 140, 148 associated to the same cell row 122 from each other. The first gate stacks 140 may be associated to memory cells that may be arranged to parallel strings 189a-189c, for example, NAND strings, which are accessible via selection transistors associated to the second gate stacks 148 formed at the two ends of each string

189a-189c. The gate stacks 140, 148 cover first portions of the main surface 101, whereas second portions between the first portions remain exposed or uncovered.

Figure 1B:
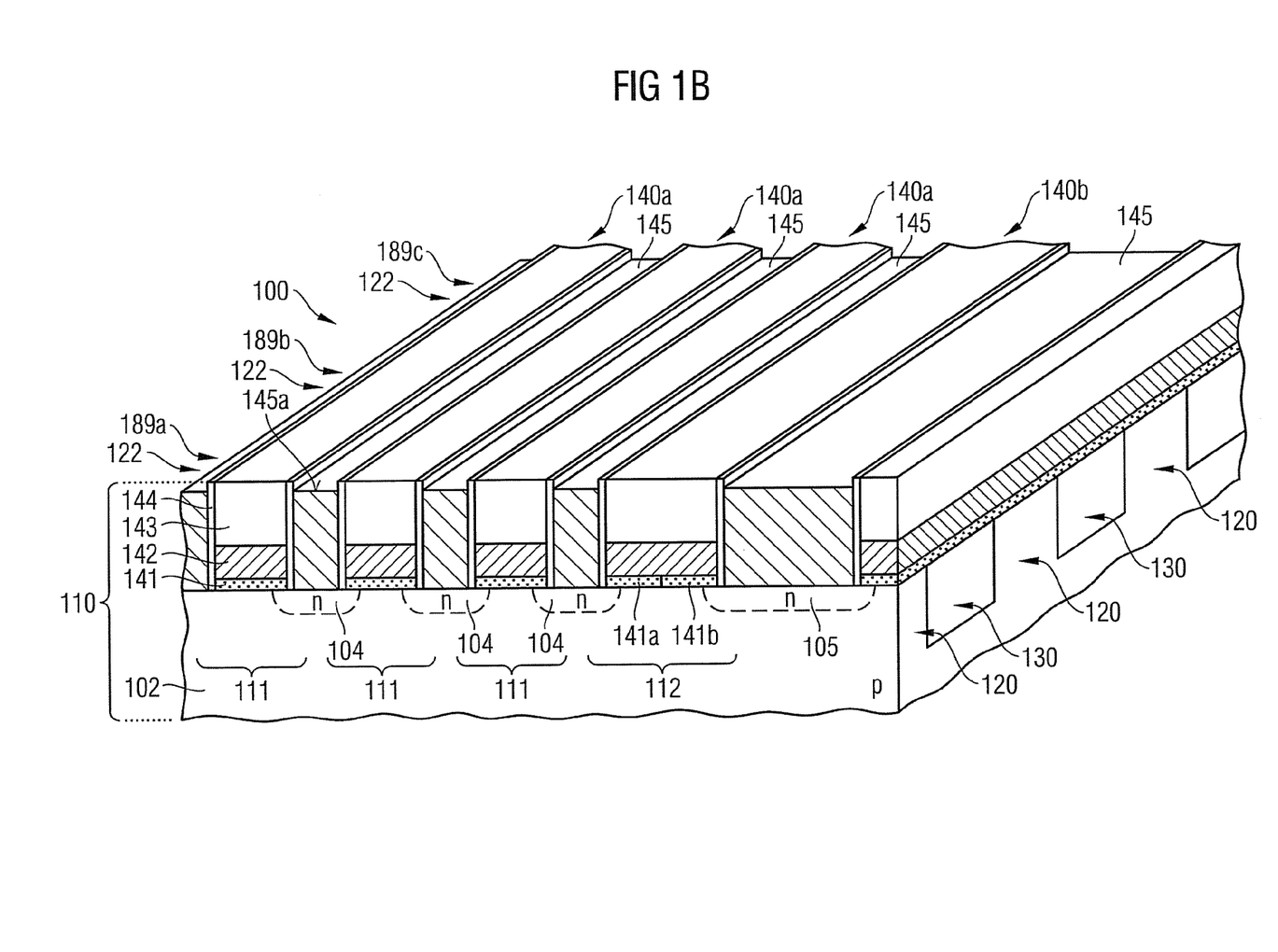
FIG. 1B illustrates a schematic perspective view of one embodiment of a substrate portion of FIG. 1A after forming sacrificial structures of a second crystalline semiconductor material between neighboring gate structures.

Referring to FIG. 1B, one or more implants may be performed to form first impurity regions 104 between the first gate stacks 140 and between the first and second gate stacks 140, 148 and second impurity regions 105 between neighboring second gate stacks 148. The first and second impurity regions 104, 105 have a conductivity type opposite to that of the surrounding, portions of the active area lines 120. The first impurity regions 104 may be lightly doped and the second impurity regions 105 may be heavily doped. In accordance with one embodiment, arsenic or phosphorus may be implanted to form n-doped impurity regions 104, 105 in p-doped or intrinsic active area lines 120 or boron may be implanted to form p-doped impurity regions 104, 105 in n-doped or intrinsic active area lines 120. The first impurity regions 104 within each string 189a-c are effective as source/drain regions of memory cells 111 associated to the first gate stacks 140 and connect neighboring memory cells 111 directly to each other. Each second impurity region 105 serves as source/drain region of the two adjoining selection transistors 112 associated to the second gate stacks 148 and may form a contact area along the main surface 101.

A second crystalline material that is different from the first crystalline semiconductor material forming the first semiconductor structure 102 is formed to fill the second grooves 149 of FIG. 1A with sacrificial structures 145. For example, the second crystalline material may epitaxially grow on the exposed surfaces of the first semiconductor structure 102. The second crystalline material may be considered as "single-crystalline", since on each of the second portions of the main surface 101 one single grain may grow. The second "single"-crystalline material may form a second lattice, wherein the first lattice may be effective as a seed for the second lattice and the second lattice may be effective as a seed for the first lattice. For example, the base structure of the second lattice is the same as that of the first lattice. For example, both lattice structures are face-centered cubic lattices, such as a diamond cubic lattice or a zinc blend lattice, by way of example. The second material, which may have the second lattice, may be a semiconducting material, a conductive material or a dielectric material such as alumina, bay way of example. The lattice constant of the first and the second lattice structure may be approximately equal or may deviate from each other by at most 10%. The sacrificial structures 145 transform the lattice information of the first single-crystalline semiconductor material from the main surface 101 to their upper surfaces 145a. If the first semiconductor material is silicon, germanium or gallium arsenide, the second semiconductor material may be a silicon germanium alloy (SiGe) with a germanium content of not more than 30 percent, by way of example. The molar relationship in the silicon germanium alloy may be selected to reliably transfer the lattice information of silicon single-crystalline on the one hand and to achieve a high etch selectivity against single-crystalline silicon on the other hand. The molar relationship may depend on the distance to the main surface 101 and may decrease with increasing distance to the main surface 101 and/or to the upper surface 145a or may have a maximum or a minimum between the main and the upper surfaces 101, 145a.

In accordance with another embodiment, an amorphous, nano-, micro-, or polycrystalline phase of silicon germanium may be deposited and recrystallized to transform the deposited silicon germanium into a single-crystalline phase. The recrystallization process may include a thermal treatment and/or laser irradiation.

As illustrated in FIG. 1B, the sacrificial structures 145 may be stripe-shaped and may extend along a direction intersecting the cell rows 122. Each sacrificial structure 145 alternatingly runs above active area lines 120 and shallow trench isolation structures 130. According to one or more embodiments, the sacrificial structures 145 may be dot-shaped or may form a grid or an irregular pattern. Above the active area lines 120, the sacrificial structures 145 are disposed above or may bear on the impurity regions 104, 105. An upper surface 145a of the sacrificial structures 145 is uncovered. The sidewall spacers 144 are arranged between the gate stacks 140, 148 and the sacrificial structures 145. The address and select lines 140a, 140b, the active area lines 120, and the shallow trench isolation structures 130 form a first tier 110 in which first memory cells 111 and first selection transistors 112 are formed.

Figure 1C:
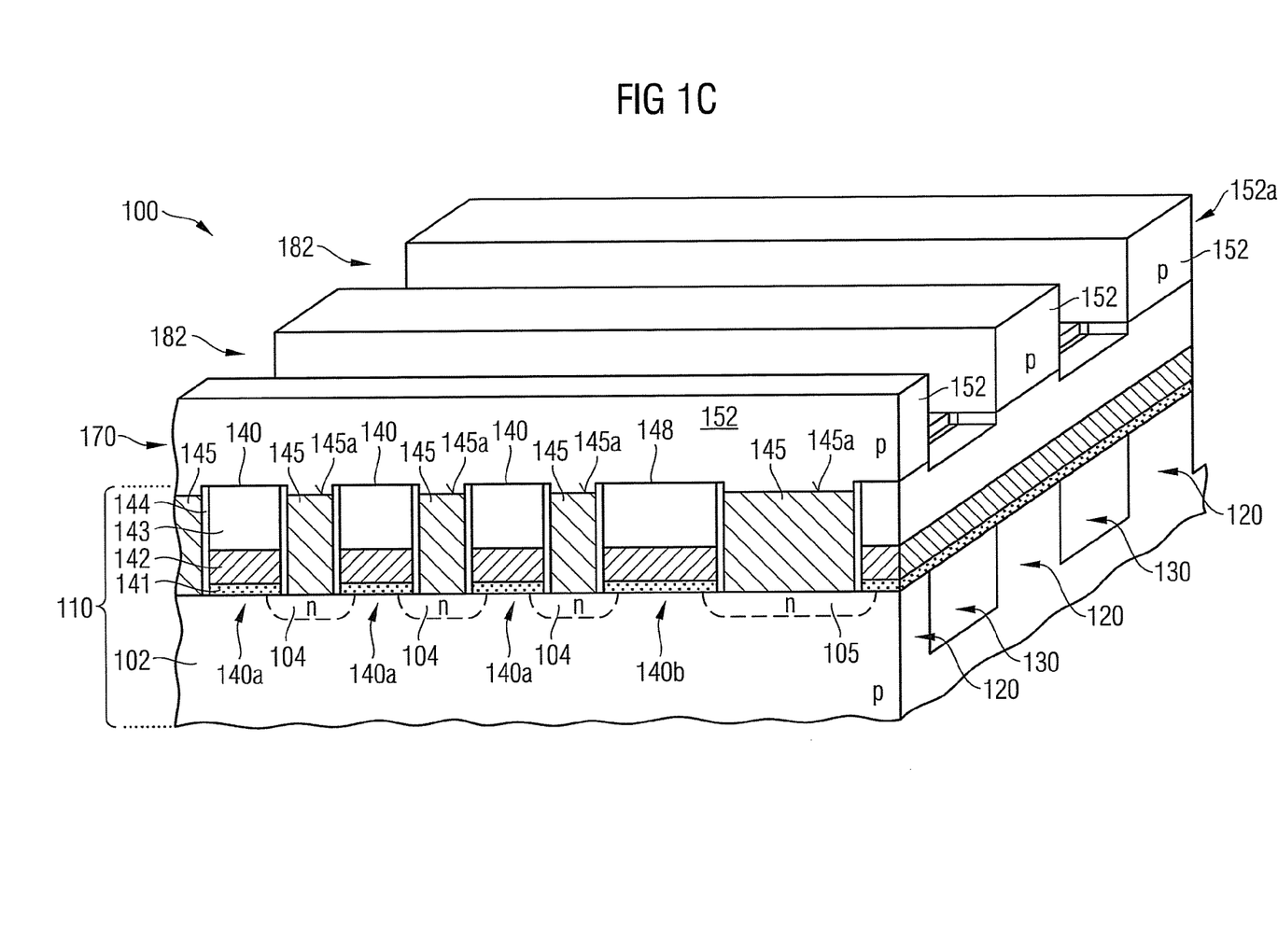
FIG. 1C illustrates a schematic perspective view of one embodiment of a substrate portion of FIG. 1B after forming grooves in a second semiconductor structure in a second tier above the sacrificial structures.

Referring to FIG. 1C, a second semiconductor structure 152a of the first crystalline semiconductor material is formed on the exposed upper surfaces 145a of the sacrificial structures 145. The second semiconductor structure 152a may span over the address and select lines 140a, 140b in the first tier 110. For example, the second semiconductor structure 152a may form a continuous, approximately single-crystalline layer. The first semiconductor material may epitaxially grow on the "single" crystalline sacrificial structures 145, wherein the epitaxy overgrows laterally the dielectric caps 144. Embodiments may be based on selective epitaxial growth and lateral solid phase epitaxy or on selective epitaxial growth and/or laser epitaxial growth. For example, amorphous, nano-, micro- or polycrystalline silicon may be deposited and recrystallized, for example, using a thermal treatment or laser irradiation. The second crystalline material of the sacrificial structures 145 is effective as a crystal seed. The sacrificial structures 145 transfer the lattice information from the first semiconductor structure 120 to the second semiconductor structure 152a, which is part and base of a second tier, in and above which second structures may be formed thereafter. The material of the second semiconductor structure may be considered as "single-crystalline", since on each of the sacrificial structures 145 one single crystallite (grain) may grow and grain boundaries mainly occur where the grains abut each other within the second semiconductor structure. Unlike in typical nano-, micro,- or polycrystalline layers, the position of the grains (crystallites) is predictable and linked to the position of the sacrificial structures 145.

Referring further to FIG. 1C, a third mask material, for example, carbon, silicon nitride, amorphous silicon or polysilicon, may be deposited on the second semiconductor structure using CVD, HDP-CVD, ALD, MOCVD, PVD, JVD, by way of example. The third mask material may be patterned by lithography techniques, which may include double patterning methods like pitch multiplication, to form a third hard mask with third mask stripes that may run parallel to and approximately in the vertical projection of the active area lines 120 in the first tier 110. Using the third hard mask as an etch mask, an anisotropic etch may cut through the second semiconductor structure 152a to form stripe-shaped semiconductor structures 152 and third grooves 182 separating neighboring semiconductor structures 152. The third grooves 182 may uncover portions of the sacrificial structures 145 between the address and select lines 140a, 140b. The etch may stop at the upper edge of the dielectric caps 144 or at the upper edge of the sacrificial structures 145.

FIG. 1C illustrates the third grooves 182 that are disposed between neighboring stripe-shaped semiconductor structures 152. The third grooves 182 may approximately be aligned to the shallow trench isolation structures 130 in the first tier 110.

Approximately in the vertical direction of the first active area lines 120 of the first tier 110, the stripe-shaped semiconductor structures 152 form second active area lines 170. The dielectric caps 144 form at least portions of a first interlayer dielectric (ILD). A spacer-like etch stop liner may be formed at the exposed sidewalls of the second active area lines 170.

Figure 1D:
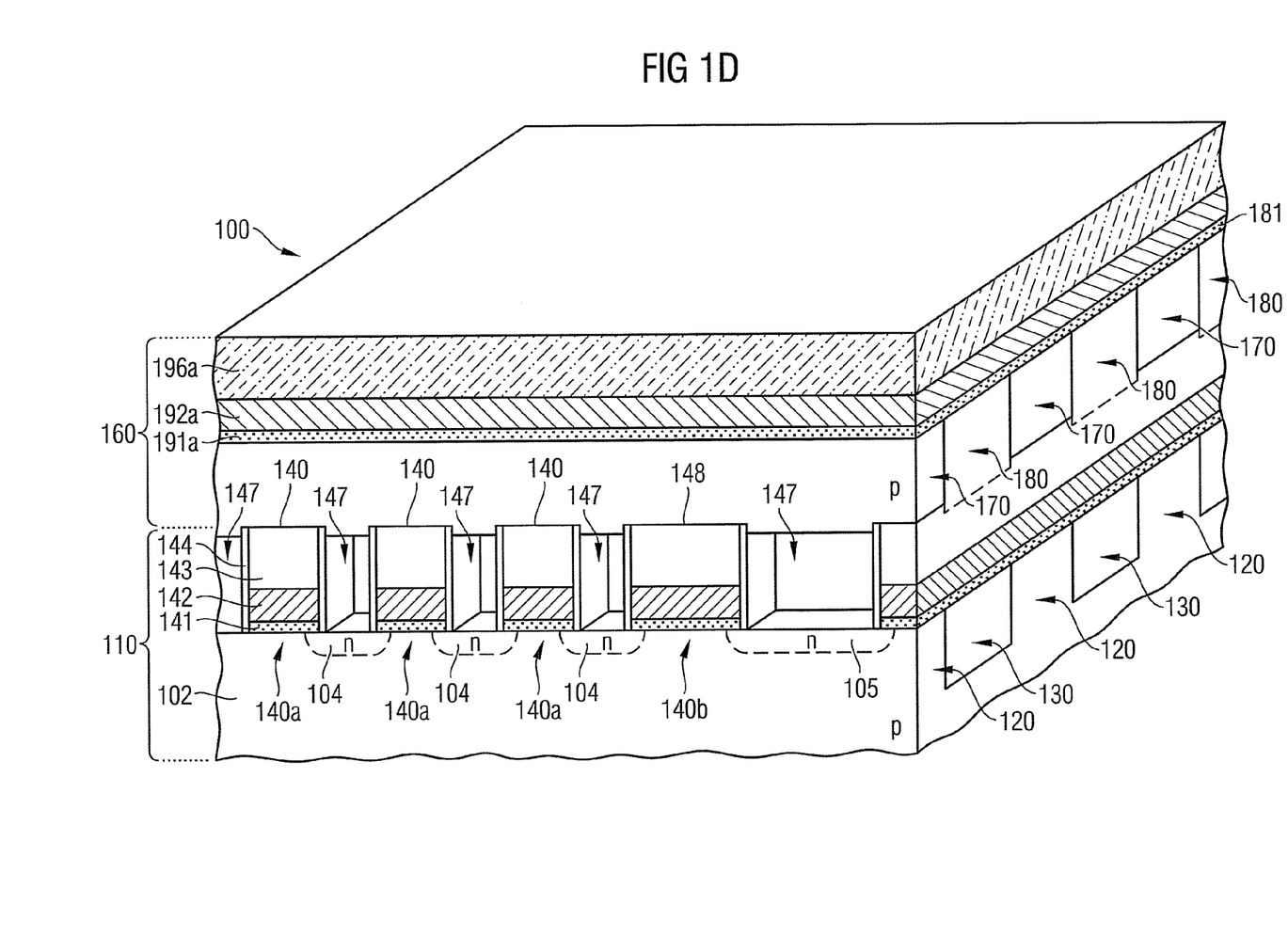
FIG. 1D illustrates a schematic perspective view of one embodiment of a substrate portion of FIG. 1C after removing the sacrificial structures and forming further layers of the second tier.

Referring to FIG. 1D, an isotropic etch process may selectively remove the sacrificial structures 145 to form gaps below the second active area lines 170 and between the address and select lines 140a, 140b above the first and second impurity regions 104, 105.

A second insulator material may be deposited to fill the third grooves 182 of FIG. 1C in parts or completely using CVD, HDP-CVD, ALD, MOCVD, PVD, JVD, by way of example. The second insulator material may be a dielectric material such as $SiO_2$, $Si_xO_y$, BSG, BPSG, FSG, by way of example. For example, the second insulator material may be the same material as the first insulator material of the shallow trench isolation structures 130. The deposition process may be controlled highly non-conformally, such that the gaps below the second active area lines 170 are left unfilled and the deposited second insulator material approximately fills the third grooves 182 of FIG. 1C between an upper and a lower edge of the active area lines 170. According to another embodiment, the second insulator material may fill the grooves above the shallow trench isolation structures 130 but does not fill the gaps between the first and second active area lines 120, 170 completely such that the gaps may form unfilled chambers 147. According to yet another embodiment, the second insulator material fills the chambers 147 at least partly. Portions of the second insulator material, which may be deposited on the third hard mask or, if the third hard mask has been removed before the deposition of the second insulator material, on the second active area lines 170, and, if applicable, the third hard mask may be removed, for example, via a wet etch or a chemical mechanical polishing such that remnant portions of the second insulator material in the second grooves 182 form shallow isolation structures 180 and the upper edges of the second active area lines 170 and the shallow isolation structures 180 form an approximately planar surface 181. Second structures may be formed in the following above the approximately planar surface 181.

According to one embodiment, the second structures may be gate electrodes of field effect transistors (FETs) or transistor-based volatile or non-volatile memory cells, by way of example. In accordance with another embodiment, the second structures extensively correspond to the first structures in function and structure.

As illustrated in FIG. 1D, the formation of the second structures may include, by way of example, depositing a second storage system 191a on the planar surface 181 and depositing a second gate conductor system 192a onto the second storage layer system 191a to form a second gate layer stack. The second storage system 191a may, for example, contain the same sequence of sub-layers as the first storage system 141 in the first tier 110. Accordingly, the second gate conductor system 192a may contain the same sequence of sub-layers as the gate electrodes 142 in the first tier 110. As the thermal budget to which the second tier 160 is exposed may be significantly less than that to which the first tier 110 is exposed, the second gate conductor system 192a may contain other materials with higher conductivity facilitating the formation of thinner gate electrodes. For example, the gate conductor system 192a may include a metal layer such as a tungsten layer. A fourth mask material, for example, carbon, silicon nitride, amorphous silicon or polysilicon may be deposited on the second gate conductor system 192a using CVD, HDP-CVD, ALD, MOCVD, PVD, JVD, by way of example.

Figure 1E:
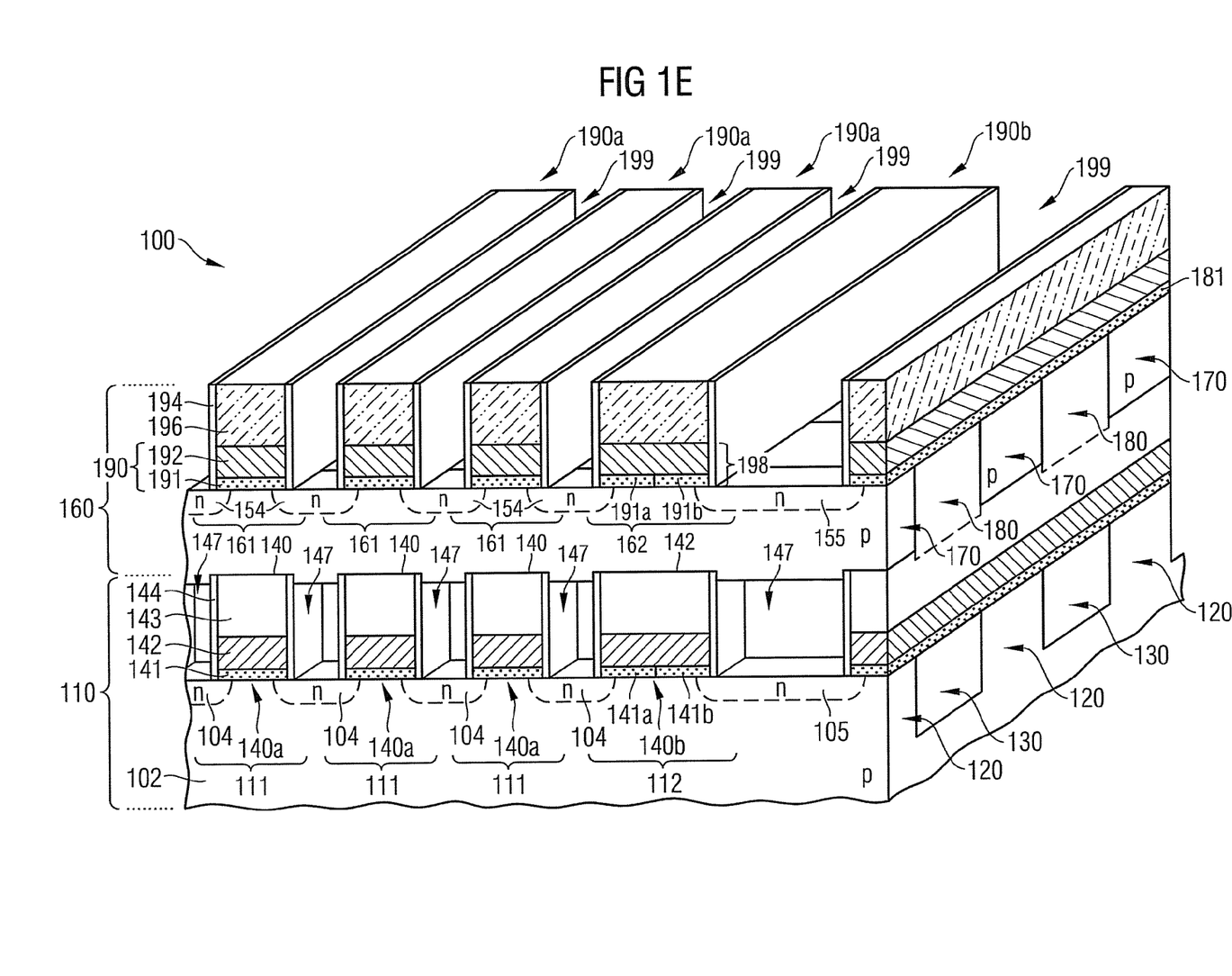
FIG. 1E illustrates a schematic perspective view of one embodiment of a substrate portion of FIG. 1D after forming gate structures and doped regions in the second tier.

Referring to FIG. 1E, the fourth mask material may be patterned by lithography techniques, which may include double patterning methods like pitch multiplication, to form a fourth hard mask with fourth mask stripes. In accordance with one embodiment, the fourth mask stripes run parallel to and approximately in the vertical projection of the address and select lines 140a, 140b in the first tier 110.

Using the fourth hard mask as an etch mask, an anisotropic etch may cut through the second gate layer stack to form stripe-shaped address and select lines 190a, 190b of a second tier 160 that includes further the second active area lines 170 and the shallow isolation structures 180. Fourth grooves 199 separate neighboring address and select lines 190a, 190b in the second tier 160. The etch may stop at the planar surface 181. In accordance with one or more embodiments, the shallow isolation structures 180 may be overetched. Second sidewall spacers 194 may be formed on vertical sidewalls of the address and word lines 190a, 190b in the second tier 160, for example, via a conformal deposition of a second dielectric material such as, for example, $SiO_2$, $Si_xO_y$, $Si_xO_yN_z$, $Si_xN_y$, using CVD, HDP-CVD, ALD, MOCVD, PVD, JVD, by way of example, and an anisotropic etch which removes horizontal portions of the deposited second dielectric material. Impurities may be implanted into the second active area lines 170 to form second impurity regions 154, 155 of a conductivity type that differs from that of the second active area lines 170. In accordance with the illustrated embodiment, n-doped third and fourth impurity regions 154, 155 are formed in p-doped second active area lines 170. In accordance with one or more embodiments, the second active area lines 170 may be n-doped and p-doped second impurity regions 154, 155 may be formed in the second active area lines 170.

Above the second active area lines 170, the address and select lines 190a, 190b in the second tier form third and fourth gate stacks 190, 198 that may include a second gate electrode 192a and a second storage system 191 or a second gate dielectric 191a, 191b. The second gate electrodes 192 result from the gate conductor system 192a of FIG. 1D and are arranged on the second storage systems 191 or the second gate dielectrics 191a, 191b. The second storage systems 191 of the third gate stacks 190 result from portions of the second storage layer system 191a of FIG. 1D and are arranged in direct contact with the respective second active area line 170. In lieu of the second storage system 191, a gate dielectric without storage layer may be formed in the fourth gate stacks 198. In accordance with another embodiment, each fourth gate stack 198 contains a storage system portion 191a equivalent to the second storage system 191 and a gate dielectric portion 191b without storage layer directly formed on the associated second active area line 170 adjacent to the storage system portion 191a. The gate dielectric portion 191b may contain one or more of the sub-layers of the storage system portion 191a. Remnant portions of the fourth hard mask 196 may form sacrificial caps 196, for example, silicon nitride caps, which may cover the gate stacks 190, 198 respectively. The first and second storage systems 141, 191 may have an equivalent structure or they may differ from each other in layer thickness and materials. The first and second gate electrodes 142, 192 may have an equivalent structure or they may differ from each other in view of materials and layer thickness. The third gate stacks 190 may be assigned to second memory cells 161 and the fourth gate stacks 198 may be assigned to second selection transistors 162 in the second tier 160.

According to the illustrated embodiment the address and select lines 190a, 190b correspond to columns of memory cells 161 and selection transistors 162 in the second tier 160 and may approximately be aligned to the columns of the first memory cells and selection transistors 111, 112 in the first tier 110. In accordance with one or more embodiments, the columns in the second tier 160 are shifted with respect to the columns in the first tier 110 by the half pitch of neighboring columns such that the second memory cells of the second tier 160 are arranged approximately in the vertical projection of the chambers 147.

Figure 1F:
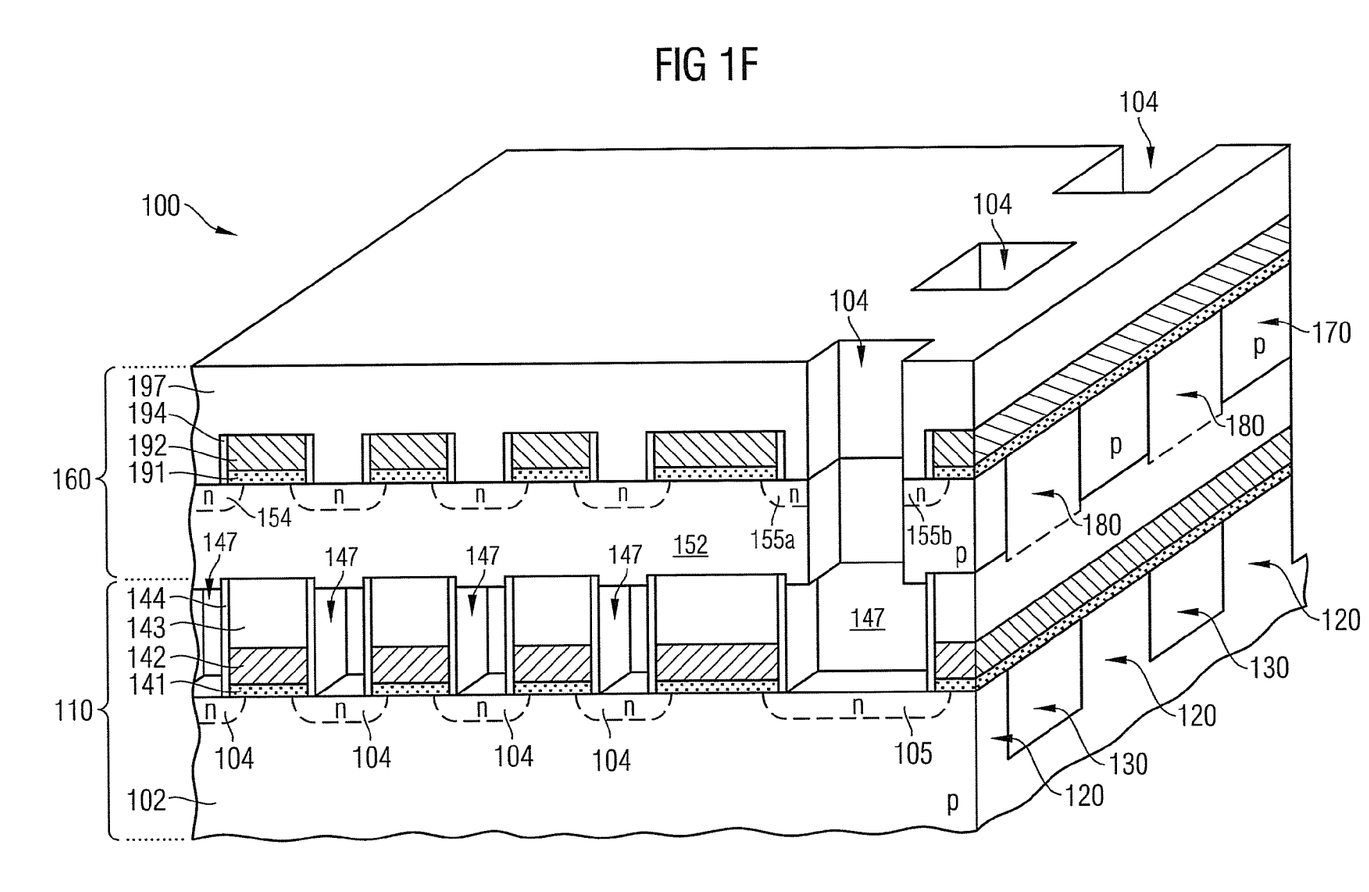
FIG. 1F illustrates a schematic perspective view of one embodiment of a substrate portion of FIG. 1E after forming contact openings.

Referring to FIG. 1F, a third insulator material may be deposited using CVD, HDP-CVD, ALD, MOCVD, PVD, JVD, by way of example, to fill the fourth grooves 199 of FIG. 1E. The third insulator material may be $SiO_2$, $Si_xO_y$, $Si_xN_y$, BSG, BPSG, and FSG and may be one of the first and second insulator materials or another one. A fourth insulator material, may replace the sacrificial caps 196 of FIG. 1F. The fourth insulator material may be $SiO_2$, $Si_xO_y$, $Si_xN_y$, BSG, BPSG, FSG and may be the same as the third insulator material. Portions of the second, third and fourth insulator material may form a second interlayer dielectric 197.

Contact openings 104 may be etched through the second interlayer dielectric 197 and the second active area lines 170, wherein the fourth impurity regions 155 in the second tier 160 may be split into sub-sections 155a, 155b with exposed sidewalls. In accordance with one embodiment, the contact openings 104 open the chambers 147 above the second impurity regions 105. According to embodiments providing an insulator fill in the chambers 147, the contact openings 104 are etched through the insulator fill to expose a contact area of the second impurity regions 105 of each pair of selection transistors 148 in the first tier 110.

Figure 1G:
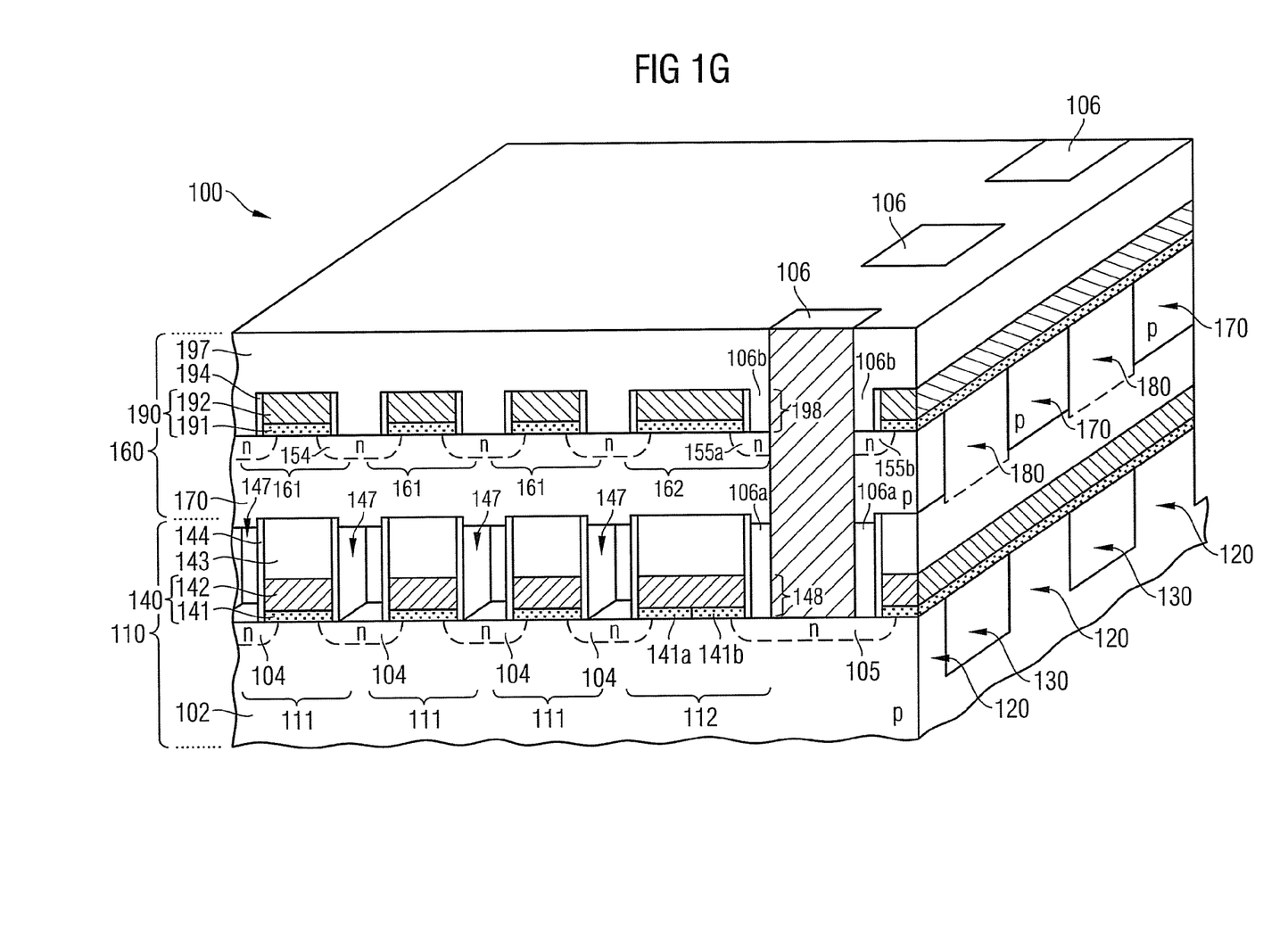
FIG. 1G illustrates a schematic perspective view of a substrate portion of an integrated circuit with stacked electronic devices in accordance with one embodiment according to which gate structures in a second tier are approximately aligned to gate structures in a first tier.

As illustrated in FIG. 1G, first sidewall spacers 106a may be formed in the opened chambers 147, for example, by depositing a conformal layer and overetching the conformal layer anisotropically. Then a conductive material may be deposited to form contacts 106 that fill the contact openings 104 of FIG. 1F.

As further illustrated in FIG. 1G, each contact 106 may be spaced from the second and fourth gate stacks 148, 198 of the associated selection transistors in the first and second tier 110, 160 via the insulating structures 106b and oxide sidewall spacers 106a. Each contact 106 contacts one of the second impurity regions 105 in the first tier 110 and the split fourth impurity regions 155a, 155b of neighboring second selection transistors 198 in the second tier 160.

In accordance with one or more embodiments, further tiers may be formed above the second tier 160 according to the formation of the second tier 160 before or after forming the contacts 106.

Figure 2:
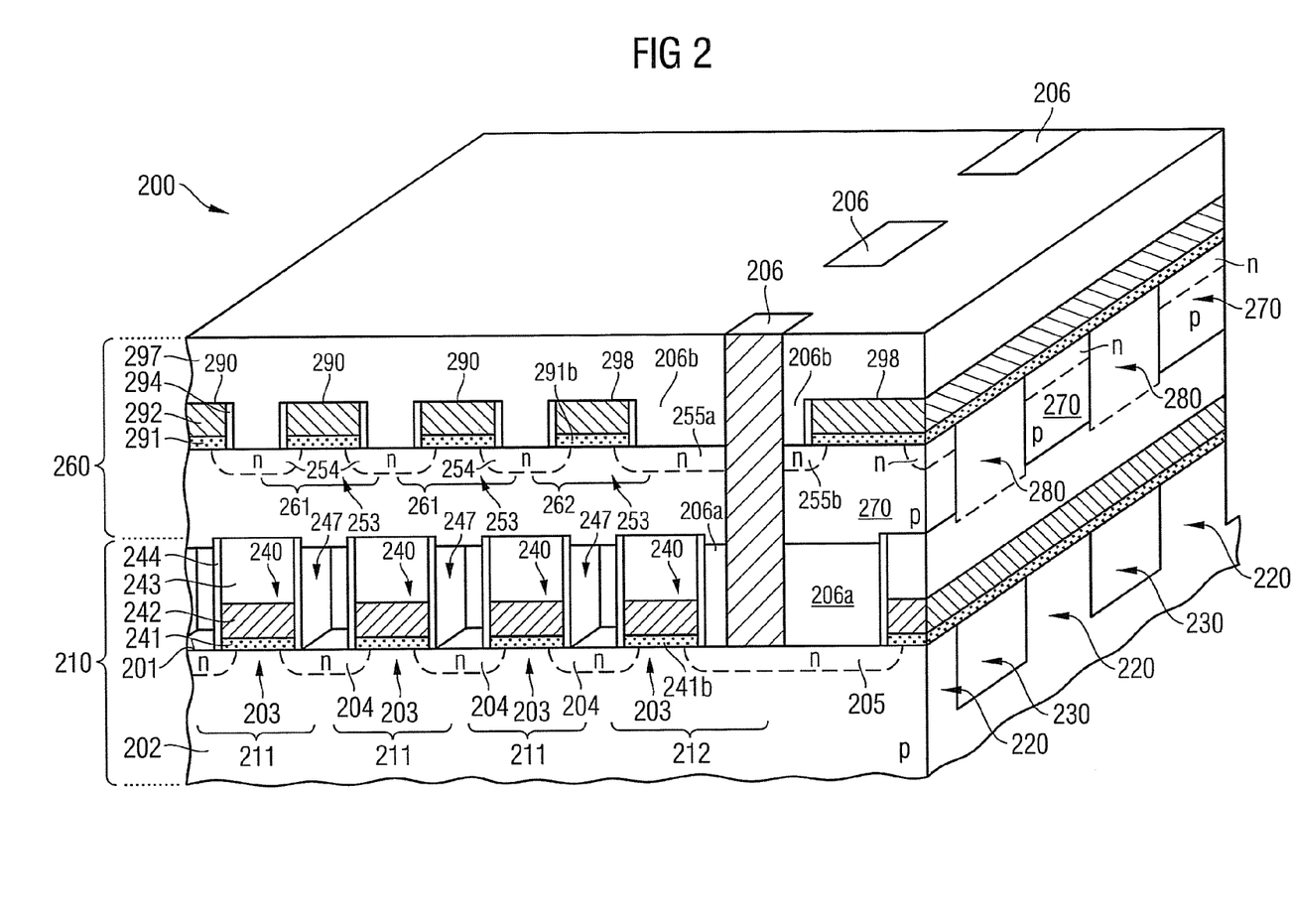
FIG. 2 illustrates a schematic perspective view of a substrate portion of an integrated circuit with stacked electronic devices in accordance with one embodiment according to which gate structures in a second tier are formed approximately above spaces between gate structures in a first tier.

FIG. 2 illustrates a portion 200 of an integrated circuit with a first tier 210 and a second tier 260 stacked upon the first tier 210. Each tier 210, 260 contains semiconductor devices 261, 262, 211, 212, which may be field effect transistors for logic applications, interface applications or non-volatile memory cells which may be based on field effect transistors and which may be arranged according to a NAND-, NOR- or AND-architecture, by way of example. Semiconducting portions of first semiconductor devices 211, 212 are formed in first active areas 220 in the first tier 210 and semiconducting portions of second semiconductor devices 261, 262 are formed in second active areas 270 in the second tier 260. In accordance with one embodiment, the first and second active areas 220, 270 may be stripe-shaped active area lines, wherein first isolation structures 230 are formed between neighboring first active areas 210 and second isolation structures 280 are formed between neighboring second active areas 270. In accordance with one or more embodiments, the first and second active areas 220, 270 may be dot-shaped and/or may be arranged in a regular or an irregular pattern.

By way of example, the first semiconductor devices 211, 212 may be first memory cells 211 and first selection transistors 212 arranged in serial connection to strings with one of the first selection transistors 212 at each string end. The second semiconductor devices 261, 262 may be second memory cells 261 and second selection transistors 262 arranged in serial connection to strings with one of the second selection transistors 262 at each string end respectively. The first and second memory cells 211, 261 may be non-volatile memory cells based on a field effect, wherein a threshold voltage of the respective memory cell 211, 261 may depend on a charge stored in a storage system 241, 291 or a polarization state of the storage system 241, 291. Within the active areas 220, 270 source/drain regions 204, 254 of the memory cells 211, 261 are formed which connect neighboring memory cells 211, 261 with each other and with associated selection transistors 212, 262. Further source/drain regions 205, 255a, 255b between neighboring selection transistors 212, 262 form contact regions in the longitudinal projection of each cell string. Contacts 206 may be disposed above or may bear on the further source/drain regions 205 in the first tier 205 and may intersect further source/drain regions 255a, 255b in the second tier 260. First gate stacks 240 are associated to first memory cells 211, second gate stacks 248 to first selection transistors 262, third gate stacks 290 to second memory cells 261 and fourth gate stacks 298 to second selection transistors 262. The gate stacks are formed above the associated active areas 220, 270 respectively. Each first gate stack 240 may include a first storage system 241 and a first gate electrode 242 above the first storage system 241, each second gate stack 248 a first gate dielectric 241b and a first gate electrode 242 above the first gate dielectric 241b, each third gate stack 290 a second storage system 291 and a second gate electrode 292 above the second storage system 291, each fourth gate stack 298 a second gate dielectric 291b and a second gate electrode 292 above the second gate dielectric 291b.

Each second active area 270 may be arranged approximately in the vertical projection of one of the first active areas 220. A potential applied to the gate electrodes 242, 292 capacitively controls a current in a channel region 203, 253 between the both source/drain regions 204, 205 associated to the same memory cell 211, 261.

Chambers 247, which may be filled with vacuum or a gaseous fluid, may be formed between the gate stacks 240, 248 of the first tier. Dielectric caps 244 formed on each gate stack 240 may be effective as a first interlayer dielectric electrically insulating the second active areas 270 from underlying structures. Gate spacers 244, 294 may extend along vertical sidewalls of the gate structures 240, 248, 290, 298. An interlayer dielectric 297 may fill spaces between the gate stacks 290, 298 of the second tier 260 and may capacitively decouple the semiconductor devices 261, 262 in the second tier 260 from further conductive structures formed above the second interlayer dielectric 297. With regard to the used materials, reference is made to the description of the embodiments according to FIG. 1A to FIG. 1G.

The gate structures 290, 298 in the second tier 260 may be shifted with respect to the gate stacks 240, 248 in the first tier 210 along a direction, in which the cell strings run. As a result, the channel regions 253 of the second memory cells 261 and the second selection transistors 262 may be formed above the chambers 247. This arrangement facilitates the formation of the second tier channel regions 253 in vertical projection of seed areas used for the formation of the second active areas 270. In the vertical projection of a seeding area, less crystal or lattice defects occur in an epitaxy layer grown on the seeding areas than in portions laterally grown above non-seeding areas. The epitaxy may start on a plurality of seeding areas, for example, on sacrificial structures above each of the source/drain regions 204, 205 in the first tier 210. Lattice defects like crystal boundaries may therefore predominantly occur in the vertical projection of areas between the seeding areas.

Typically, lattice defects in the channel region 253 are more critical with respect to device performance than crystal defects in the more heavily doped source/drain regions 252, 255a, 255b. An arrangement with the gate stacks 290, 298 of the second tier 260 shifted with respect to the gate stacks 240, 248 in the first tier 210 facilitates the formation of channel regions 253 having few lattice defects.

In accordance with further embodiments, the gate stacks 240, 248, 290, 298 in the first and second tier 210, 260 may have approximately the same distance between the associated source/drain regions 204, 205, 254, 255a, 255b.

Figure 3:
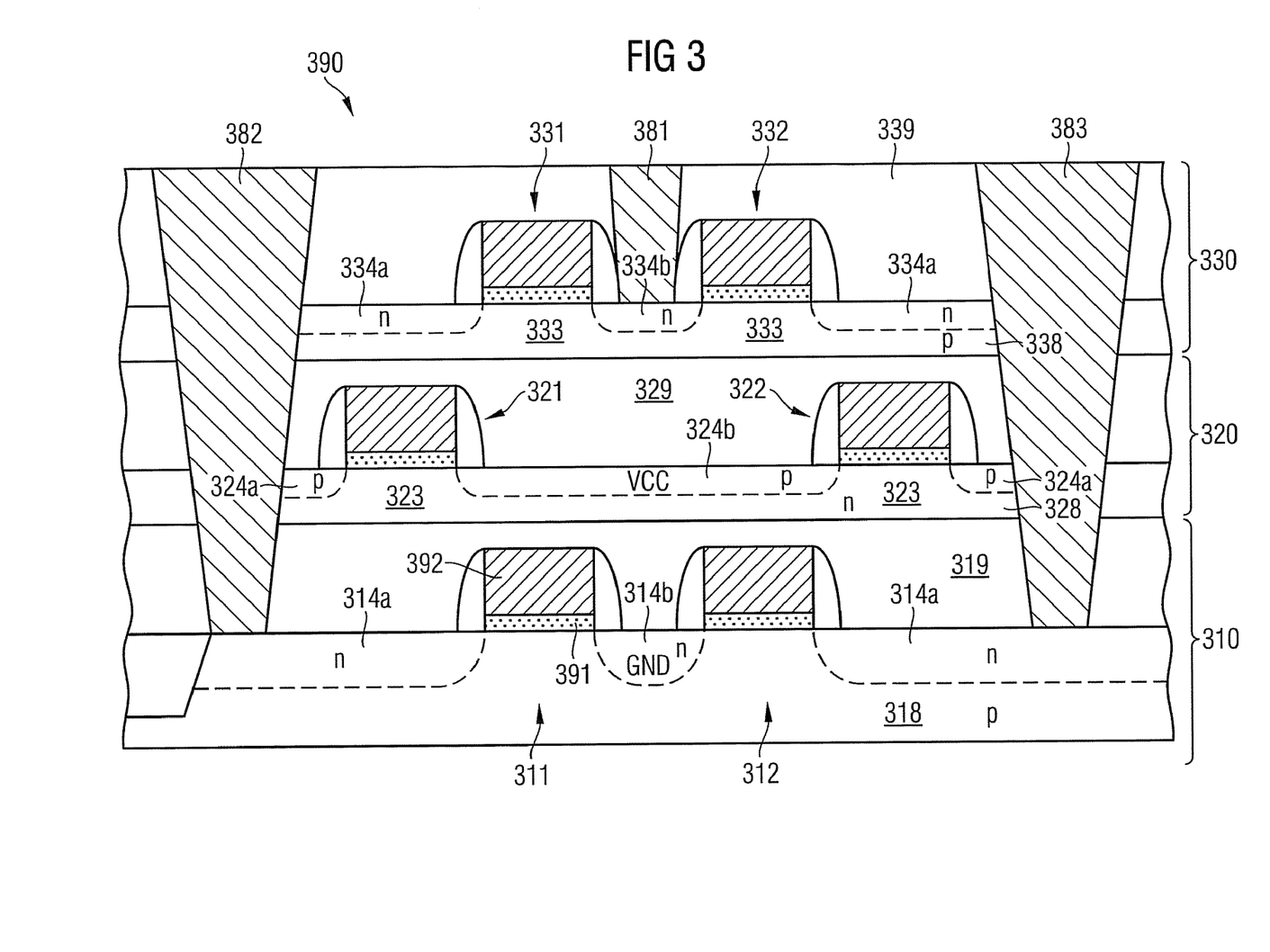
FIG. 3 illustrates a schematic cross-sectional view of a substrate portion with a stacked 6T-SRAM(static random access memory) cell in accordance with one embodiment with shifted stacked gate structures.

FIG. 3 refers to a 6T static random access memory (SRAM) cell 390, wherein the transistors 300, 311, 312, 321, 322, 331, 332 may be arranged in three tiers 310, 320, 330 stacked upon each other. Two p-FETs 321, 322 and to n-FETs 311, 312 may be connected to form a latch, wherein the latch is accessible via two pass transistors 331, 332. First and second node contacts 382, 383 form a portion of a latch wiring and provide a low-resistance path between first source/drain regions 334a of the pass transistors 331, 332, first source/drain regions 324a of the p-FETs 321, 322 and first source/drain regions 314a of the n-FETs 311, 312. The second source/drain regions 314b of the n-FETs 311, 312 are connected to each other and to a device that may supply a negative supply voltage. The second source/drain regions 324b of the p-FETs 321, 322 are connected to each other and to a device that may supply a positive supply potential. The second source/drain regions 334b of the pass transistors 331, 332 may be alternatingly connected to a common bit line via a contact 381 or to two different bit lines. The transistors 300, 311, 312, 321, 322, 331, 332 may be arranged with the gate stacks of neighboring tiers 310, 320, 330 shifted towards each other such that the channel regions 323, 333 in the second and third tier 320, 330 are approximately arranged above and in the vertical projection of source/drain regions formed in the respective underlying tier.

Figure 4:
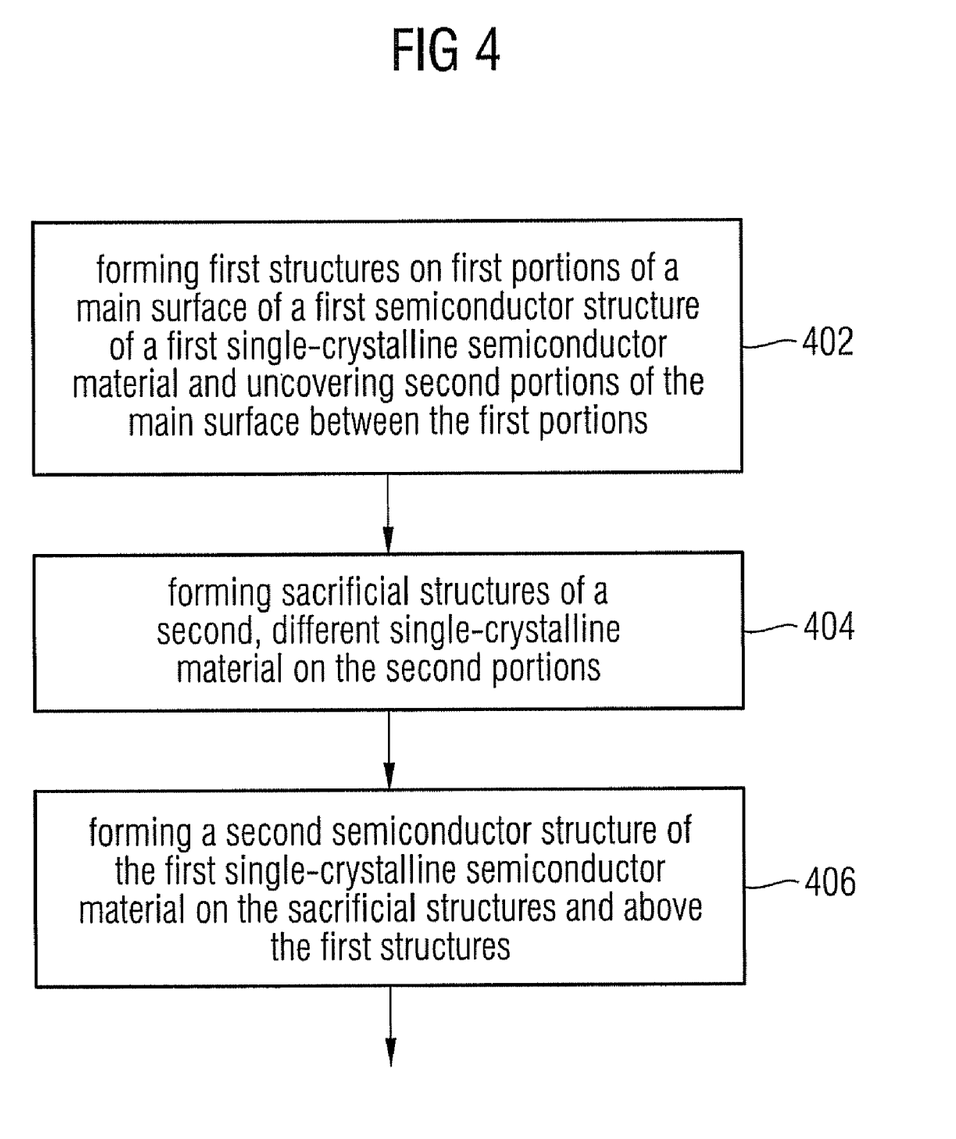
FIG. 4 is a simplified flow chart illustrating a method of manufacturing an integrated circuit in accordance with one embodiment.

FIG. 4 illustrates a flow chart of a method of manufacturing an integrated circuit in accordance with another embodiment. A main surface of a first semiconductor structure of a first single-crystalline semiconductor material having a first lattice includes first and second portions. First structures are formed on the first portions, wherein the second portions remain uncovered (402). Sacrificial structures of a second, different material are formed on the second portions (404). A second semiconductor structure of the first singe-crystalline semiconductor material is formed on the sacrificial structures and above the first structures (406).

The first single-crystalline semiconductor material may have a first lattice and the second single-crystalline material may have a second lattice, wherein the first lattice may be effective as a seed for the second lattice and the second lattice may be effective as a seed for the first lattice. For example, the base structure of the second lattice may be the same as that of the first lattice. In accordance with one embodiment, both lattice structures are face-centered cubic lattices, such as a diamond cubic lattice or a zinc blend lattice, by way of example. The lattice constant of the first and the second lattice structure may be approximately equal or may deviate from each other by at most 10%. The sacrificial structures are configured to transform the lattice information of the first single crystalline semiconductor material from the first semiconductor structure to an upper edge of the first structures such that the first structures can be effective as a seed for growing the second semiconductor structure of the first crystalline semiconductor material on the sacrificial structures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing an integrated circuit, the method comprising:
    forming first structures on first portions of a surface of a first semiconductor structure of a first crystalline semiconductor material;
    forming sacrificial structures of a second crystalline material on second portions of the surface between the first portions, wherein the first crystalline semiconductor material is effective as a crystal seed for the second crystalline material;
    forming a second, crystalline semiconductor structure of the first crystalline semiconductor material over the sacrificial structures and over the first structures, wherein the sacrificial structures are effective as a crystal seed for the first crystalline semiconductor material; and
    removing the sacrificial structures to form voids between neighboring first structures respectively.

2. The method of claim 1, wherein the second crystalline material is a second crystalline semiconductor material different from the first crystalline semiconductor material.

3. The method of claim 1, wherein a first lattice constant of the first crystalline semiconductor material and a second lattice constant of the second crystalline material deviate by at most 10% from each other.

4. The method of claim 1, wherein the first crystalline semiconductor material is single-crystalline silicon.

5. The method of claim 4, wherein the second crystalline material has a cubic diamond lattice structure.

6. The method of claim 4, wherein the second crystalline material is a silicon germanium alloy.

7. The method of claim 4, wherein the first semiconductor structure is a silicon wafer or a silicon layer arranged upon a dielectric base.

8. The method of claim 1, further comprising:
    forming second structures on the second semiconductor structure.

9. The method of claim 1, further comprising:
    forming source/drain regions and channel regions of field effect transistor structures in the second semiconductor structure, wherein the channel regions are formed in a vertical projection above the sacrificial structures.

10. The method of claim 1, further comprising:
    forming source/drain regions and channel regions of field effect transistor structures in the second semiconductor structure, wherein the source/drain regions are formed in a vertical projection above the sacrificial structures.

11. The method of claim 1, further comprising:
removing first portions of the second semiconductor structure at least partly to uncover portions of the sacrificial structures, before removing the sacrificial structures.

12. The method of claim 1, wherein the first structures are gate electrodes of memory cells arranged to NAND strings.

13. A method of manufacturing an integrated circuit, comprising:
forming first gate structures arranged along a string on first portions of a surface of a first semiconductor structure of a first crystalline semiconductor material;
forming sacrificial structures of a second crystalline material on second portions of the surface between the first portions;
forming a second semiconductor structure of the first crystalline semiconductor material on the sacrificial structures and above the first gate structures, wherein the first portions are effective as a crystal seed for the sacrificial structures and the sacrificial structures are effective as a crystal seed for the second semiconductor structure;
removing first portions of the second semiconductor structure to uncover portions of the sacrificial structures; and
removing the sacrificial structures at least partly to form voids between neighboring first gate structures respectively.

14. The method of claim 13, wherein the first crystalline semiconductor material is single-crystalline silicon.

15. The method of claim 14, wherein the second crystalline material is a silicon germanium alloy.

16. The method of claim 13, further comprising:
forming second gate structures arranged to strings on the second semiconductor structure.

17. The method of claim 16, comprising forming the second gate structures in a vertical projection of the sacrificial structures.

18. A method of manufacturing an integrated circuit, the method comprising:
covering first portions of a surface of a first semiconductor carrier with a cover material, the first semiconductor carrier comprising a first crystalline semiconductor material;
forming a sacrificial crystalline material over second portions of the surface between the first portions, wherein the first crystalline semiconductor material is effective as a crystal seed;
forming first crystalline semiconductor material over the sacrificial crystalline material and over the first portions, wherein the sacrificial crystalline material is effective as a crystal seed; and
removing the sacrificial crystalline material at least partly to form voids between neighboring first portions respectively.

* * * * *